(12) United States Patent
Yeh et al.

(10) Patent No.: US 9,825,005 B2
(45) Date of Patent: Nov. 21, 2017

(54) SEMICONDUCTOR PACKAGE WITH PILLAR-TOP-INTERCONNECTION (PTI) CONFIGURATION AND ITS MIS FABRICATING METHOD

(71) Applicant: POWERTECH TECHNOLOGY INC., Hsinchu (TW)

(72) Inventors: Yun-Hsin Yeh, Hsinchu (TW); Hung-Hsin Hsu, Hsinchu (TW)

(73) Assignee: Powertech Technology Inc., Hsinchu County (TW)

( * ) Notice: Subject to any disclaimer, the term of this patent is extended or adjusted under 35 U.S.C. 154(b) by 0 days.

(21) Appl. No.: 14/960,962

(22) Filed: Dec. 7, 2015

(65) Prior Publication Data
US 2017/0053898 A1 Feb. 23, 2017

(30) Foreign Application Priority Data
Aug. 21, 2015 (TW) .............................. 104127307 A

(51) Int. Cl.
*H01L 25/04* (2014.01)
*H01L 23/31* (2006.01)
(Continued)

(52) U.S. Cl.
CPC ...... *H01L 25/0657* (2013.01); *H01L 21/4853* (2013.01); *H01L 21/6835* (2013.01);
(Continued)

(58) Field of Classification Search
CPC ............... H01L 23/3128; H01L 23/481; H01L 23/49827; H01L 23/49838; H01L 24/17;
(Continued)

(56) References Cited

U.S. PATENT DOCUMENTS

| 2008/0073795 A1* | 3/2008 | Kohl | ...................... H01L 24/10 257/774 |
| 2011/0095413 A1* | 4/2011 | Barth | .................... H01L 21/568 257/685 |
| 2013/0037929 A1* | 2/2013 | Essig | ................ H01L 23/49816 257/693 |

OTHER PUBLICATIONS

Newnes Electronic Dictionary of Electronics (http://search.credoreference.com), © 1999; "encapsulation".*

* cited by examiner

*Primary Examiner* — Johannes P Mondt
(74) *Attorney, Agent, or Firm* — JCIPRNET

(57) ABSTRACT

Disclosed is a semiconductor package with Pillar-Top-Interconnection (PTI) configuration, comprising a redistribution layer (RDL) formed on a carrier plane, a plurality of metal pillars disposed on the RDL, a chip bonded onto the RDL, and a molding core. The molding core is formed on the carrier plane and has a bottom surface defined by the carrier plane so that the RDL is embedded inside the molding core. The package thickness of the molding core is greater than the chip-bonding height of the chip so that the chip is completely embedded inside the molding core. The metal pillars are encapsulated at the peripheries of the molding core with a plurality of pillar top portions exposed from the molding core. The exposed pillar top portions are reentrant from a top surface of the molding core and uneven. Accordingly, it realizes the effects of ultra-thin and smaller footprint POP stacked assembly with fine pitch vertically electrical connections in POP structure. Also, it is possible to achieve zero spacing between POP stacked assembly.

6 Claims, 7 Drawing Sheets

(51) Int. Cl.
*H01L 23/48* (2006.01)
*H01L 25/065* (2006.01)
*H01L 23/00* (2006.01)
*H01L 23/498* (2006.01)
*H01L 21/683* (2006.01)
*H01L 25/00* (2006.01)
*H01L 21/48* (2006.01)
H01L 21/56 (2006.01)
H01L 25/10 (2006.01)

(52) U.S. Cl.
CPC ...... *H01L 23/481* (2013.01); *H01L 23/49838* (2013.01); *H01L 24/17* (2013.01); *H01L 24/81* (2013.01); *H01L 25/50* (2013.01); H01L 21/568 (2013.01); H01L 23/3107 (2013.01); H01L 25/105 (2013.01); H01L 2221/68345 (2013.01); H01L 2221/68359 (2013.01); H01L 2224/16145 (2013.01); H01L 2224/16227 (2013.01); H01L 2224/81191 (2013.01); H01L 2225/06524 (2013.01); H01L 2225/06548 (2013.01); H01L 2924/1511 (2013.01); H01L 2924/15321 (2013.01)

(58) Field of Classification Search
CPC ..... H01L 24/81; H01L 25/50; H01L 25/0657; H01L 2224/97; H01L 2224/16145; H01L 2224/16227; H01L 2224/81191; H01L 2224/32145; H01L 2225/06513; H01L 2225/06517; H01L 2225/06548; H01L 2924/1511; H01L 2924/15321
USPC ....... 257/685, 686, 687, 738, 774, 777, 778, 257/790
See application file for complete search history.

US 9,825,005 B2

SEMICONDUCTOR PACKAGE WITH PILLAR-TOP-INTERCONNECTION (PTI) CONFIGURATION AND ITS MIS FABRICATING METHOD

FIELD OF THE INVENTION

The present invention relates to a semiconductor package and more specifically to a semiconductor package with Pillar-Top-Interconnection (PTI) configuration to be implemented in POP stacked assembly and a method for the manufacturing the same by utilizing Molded-Interconnect-Substrate (MIS) process.

BACKGROUND OF THE INVENTION

POP (Package-On-Package) is formed by vertically stacking a plurality of semiconductor packages to manufacture a 3D stacked assembly where the top semiconductor package is mounted on the bottom semiconductor package by SMT (Surface Mounting). The vertically electrical interconnection between the stacked packages is connected by a plurality of upper solder balls of the top semiconductor package with ball-on-ball interconnection where a POP stacking gap is inevitable. Moreover, an encapsulant of the bottom semiconductor package is formed on a chip carrier substrate where a molding height is added and the peripheries of the encapsulant encapsulate a plurality of interposer solder balls as vertically electrical interconnection elements. Before encapsulation, the interposer solder balls are disposed on a bottom substrate of the bottom semiconductor package by ball placement processes. After encapsulation, part surfaces of the interposer solder balls are exposed from the encapsulant by laser drill process or grinding process. During POP stacked assembly, the upper solder balls of the top semiconductor package are physically and electrically connected to the exposed surfaces of the encapsulated interposer solder balls of the bottom semiconductor package where the number and the layout of the vertically interconnection elements are limited by the diameters and the pitches of the encapsulated solder balls.

As shown in FIG. 1, a conventional bottom semiconductor package 300 implemented in POP stacked assembly comprises an encapsulant 310, a plurality of filled solder pastes 320, a chip 330, a substrate 340, and a plurality of solder balls 390. The substrate 340 has multi-layer of circuitry with a plurality of plated through holes 343 in substrate core. The chip 330 is bonded onto and electrically connected to the top surface 342 of the substrate 340 by a plurality of bumps 331 using flip-chip bonding technology. The encapsulant 310 is formed on the top surface 342 of the substrate 340 to encapsulate the chip 330. A plurality of through mold holes 311 (TMV) are disposed at the peripheries of the encapsulant 310 by drilling where the TMVs 311 penetrate through the encapsulant 310 to expose the peripheral pads of the substrate 340. The filled solder pastes 320 are then disposed inside the TMVs 311 for solder balls interconnections of POP stacked assembly. Even reflowing, the filled solder pastes 320 can not be shaped as solder balls under the limitation of the TMVs 311, but the fabrication of the TMVs 311 is difficult. The solder balls 390 are disposed on the bottom surface 341 of the substrate 340. In a more advanced POP stacked assembly, the bottom semiconductor package with a thinner package height, a smaller stacking gap, and a smaller package footprint with smaller pitches of vertically interconnection is expected.

SUMMARY OF THE INVENTION

The main purpose of the present invention is to provide a semiconductor package with Pillar-Top-Interconnection (PTI) configuration and its manufacturing method by Molded-Interconnect-Substrate (MIS) process where conventional molding thickness on IC substrate and conventional POP stacking gap between the stacked packages can be eliminated whereas POP stacked assembly with ultra-thin and smaller footprint can be achieved through repeating MIS processes to further shrink the layout pitch of vertically electrical interconnection.

The second purpose of the present invention is to provide a semiconductor package with Pillar-Top-Interconnection (PTI) configuration and its manufacturing method by Molded-Interconnect-Substrate (MIS) process to achieve zero gaps between POP stacked assembly and to eliminate the package thickness on the substrate.

According to the present invention, a semiconductor package with Pillar-Top-Interconnection (PTI) configuration comprises a first redistribution layer (RDL), a plurality of first metal pillars, a first chip and a first molding core. The first redistribution layer is disposed on a carrier plane and includes a plurality of first fan-in pads and a plurality of first fan-out pads. The first metal pillars are disposed on the first fan-out pads. The first chip is bonded onto the first redistribution layer and is electrically connected to the first fan-in pads. The first molding core is formed on the carrier plane. The first molding core has a first bottom surface and a first top surface where the first bottom surface is defined on the carrier plane to make the first redistribution layer embedded inside the first molding core from the first bottom surface. A first package thickness of the first molding core defined from the first top surface to the first bottom surface is greater than a first chip-bonding height of the first chip so that the first chip is embedded inside the first molding core with the first metal pillars encapsulated at the peripheries of the first molding core where the first metal pillars have a plurality of first pillar top portions reentrant from the first top surface and exposed from the first molding core. In detailed, the first metal pillars are whole homogeneous metal pillars having 60~90% portions encapsulated by the first molding core. Therefore, POP stacked assembly with ultra-thin and smaller footprint and zero gaps can be achieved by stacking the semiconductor packages. Additionally, the semiconductor package can be manufactured by repeating Molded Interconnect Substrate (MIS) processes to further shrink the layout pitch of vertically electrical interconnection, which is also revealed in the present invention.

DETAILED DESCRIPTION OF THE INVENTION

With reference to the attached drawings, the present invention is described by means of the embodiment(s) below where the attached drawings are simplified for illustration purposes only to illustrate the structures or methods of the present invention by describing the relationships between the components and assembly in the present invention. Therefore, the components shown in the figures are not expressed with the actual numbers, actual shapes, actual dimensions, nor with the actual ratio. Some of the dimensions or dimension ratios have been enlarged or simplified to provide a better illustration. The actual numbers, actual shapes, or actual dimension ratios can be selectively designed and disposed and the detail component layouts may be more complicated.

Figure 1:
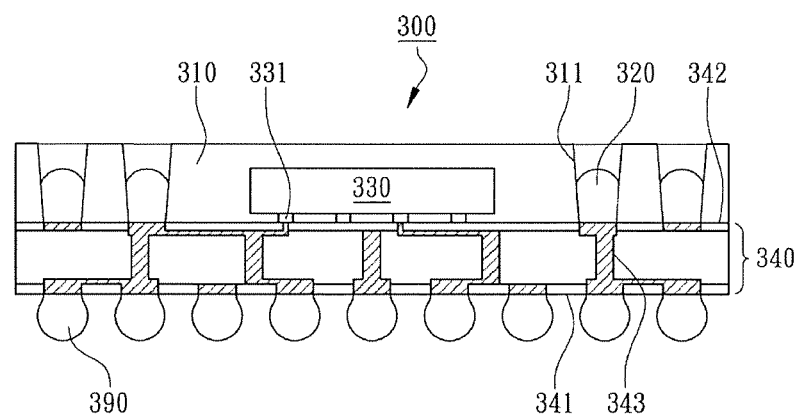
FIG. 1 is a cross-sectional view of a bottom semiconductor package of a conventional POP stacked assembly.
Figure 2:
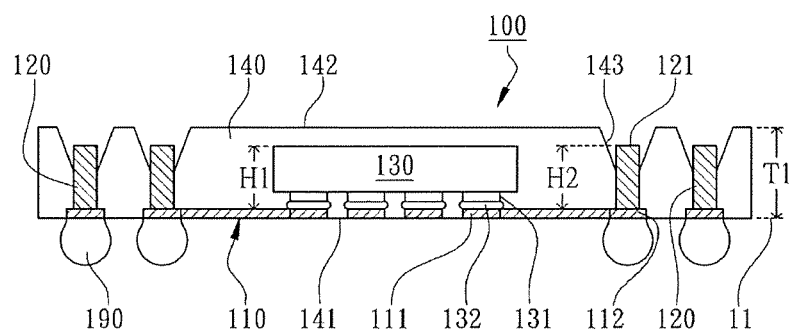
FIG. 2 is a cross-sectional view of a semiconductor package with Pillar-Top-Interconnection (PTI) configuration according to the first embodiment of the present invention.

According to the first embodiment of the present invention, a semiconductor package 100 is illustrated in FIG. 2 for a cross-sectional view and from FIGS. 3A to 3E for cross-sectional views illustrating components manufactured during each major processing step of the semiconductor package structure. The semiconductor package 100 has Pillar-Top-Interconnection (PTI) configuration and can be fabricated by utilizing Molded-Interconnect-Substrate (MIS) process. The semiconductor package 100 comprises a first redistribution layer 110, a plurality of first metal pillars 120, a first chip 130 and a first molding core 140.

Figure 3A:
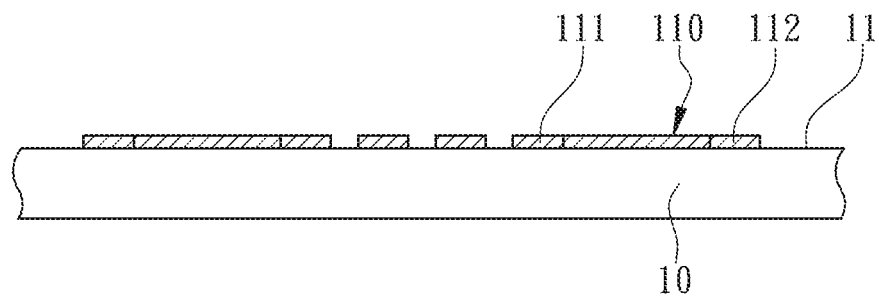
FIGS. 3A to 3E are cross-sectional views illustrating components manufactured during each major processing step of the semiconductor package by the first MIS processes according to the first embodiment of the present invention.

As shown in FIG. 2, the first redistribution layer 110 is disposed on a carrier plane 11 and the first redistribution layer 110 includes a plurality of first fan-in pads 111 and a plurality of first fan-out pads 112. The carrier plan 11 is provided by a temporary carrier 10 as shown in FIG. 3A where the temporary carrier 10 is removed after finishing the first or multiple MIS processes. The first fan-in pads 111 are parts of the first redistribution layer 110 where the pitch of the first fan-in pads 111 is smaller than the pitch of the fan-out pads 112. However, without any restriction, the pitch of the first fan-out pads 112 can be controlled under 200 μm. The first fan-out pads 112 are parts of the first redistribution layer 110 where the first fan-in pads 111 and the first fan-out pads 112 are physically and electrically connected by the corresponding traces of the first redistribution layer 110. The first redistribution layer 110 is fabricated by semiconductor IC fabrication wafer processes such as sputtering, PVD, electroplating, lithography, etc. Normally, the first redistribution layer 110 is a composite structure having multiple metal layers such as Au/Ni/Cu from top to bottom. The major conductive material of the first redistribution layer 110 may be Cu, Al or its corresponding alloy. The thickness of the first redistribution layer 110 is kept under 50 μm, however, since the first redistribution layer 110 is embedded inside the first molding core 140 from the first bottom surface 141. However, the thickness of the first redistribution layer 110 is not limited.

The first metal pillars 120 are disposed on the top surfaces of the first fan-out pads 112 where the metal pillars 120 are fabricated by electroplating. The first metal pillars 120 can be cylinder, rectangular prism, hexagonal prism, or polygonal prism. The first metal pillars 120 can be a single layer or multi-layer structure. The main body of the first metal pillars 120 can be Cu, Al, or its corresponding alloy where Cu pillars are preferred. The height of the first metal pillars 120 is not greater than the thickness of the first molding core 140. The melting point of the first metal pillars 120 is higher than the melting point of known solder paste. In a preferable embodiment, the first metal pillars 120 are whole homogeneous metal pillars having 60~90% portions encapsulated by the first molding core 140.

The first chip 130 is bonded onto the first redistribution layer 110 and is electrically connected to the first fan-in pads 111. The first chip 130 is a semiconductor component having IC circuitry. To be more specific, the first chip 130 is flip-chip bonded to the first fan-in pads 111 by a plurality of first bumps 131 planted on the first chip 130 where the first bumps 131 are connected to the first fan-in pads 111 by a plurality of first solder pastes 132 to firmly hold the first chip 130 and to ensure good electrical connection. In another embodiment, the first chip 130 can be bonded onto the first redistribution layer 110 by a die-attach adhesive and is electrically connected to the first fan-in pads 111 by bonding wires using wire bonding processes. The first solder paste 132 or the die-attach adhesive is not exposed from the first molding core 140 due to the encapsulation of the first redistribution layer 110 by the first molding core 140.

The first molding core 140 is formed on the carrier plane 11. The first molding core 140 has a first bottom surface 141 and a first top surface 142 where the first bottom surface 141 is defined on the carrier plane 11 so that the first redistribution layer 110 is embedded inside the first molding core 140 from the first bottom surface 141. In other words, the top surface and the sidewall of the first redistribution layer 110 are encapsulated by the first molding core 140 where the bottom surface of the first redistribution layer 110 and the first bottom surface 141 of the first molding core 140 are coplanar on the carrier plane 11. The material of the first molding core 140 is electrical-isolated thermosetting molding compound which can be formed by compression molding or transfer molding. The thickness of the first molding core 140 is equivalent to a substrate thickness ranged from 0.15 mm to 0.5 mm.

Furthermore, the first molding core 140 has a first package thickness T1 defined from the first top surface 142 to the first bottom surface 141 where the first package thickness T1 is greater than the first chip-bonding height H1 of the first chip 130 so that the first chip 130 is embedded inside the first molding core 140 with the first metal pillars 120 encapsulated at the peripheries of the first molding core 140. The first metal pillars 120 has a plurality of first pillar top portions 121 reentrant from the first top surface 142 and exposed from the first molding core 140. The first pillar top portions 121 are the portions of the first metal pillars 120 having the top surfaces and the exposed sidewalls of the first metal pillars 120 from the first molding core 140.

Moreover, parts of or all of the first fan-out pads 112 are ball pads. The semiconductor package 100 further comprises a plurality of solder balls 190 physically and electrically connects to the bottom surfaces of the first fan-out pads 112 and extrudes from the first bottom surface 141 for external electrical connection.

Therefore, the semiconductor package with Pillar-Top-Interconnection (PTI) configuration is revealed by the present invention, conventional molding thickness on IC substrate and conventional POP stacking gap between the stacked packages can be eliminated whereas POP stacked assembly with ultra-thin and smaller footprint can be achieved through repeating MIS processes to further shrink the layout pitch of vertically electrical interconnection.

In the present embodiment, a first pillar height H2 of the first metal pillars 120 is smaller than the first package thickness T1 of the first molding core 140 but not less than the first chip-bonding height H1 of the first chip 130 to provide more exposed pillar sidewalls included the first pillar top portions 121 of the metal pillar 120 for pillar top soldering or pillar top connection.

Preferably, the first molding core 140 further has a plurality of first dimple holes 143 on the first top surface 142 where the first pillar top portions 121 including the adjacent pillar sidewalls of the first metal pillars 120 are exposed from the first dimple holes 143 so that the first metal pillars 120 do not extrude from the first top surface 142 of the first molding core 140 and more exposed pillar sidewalls of the first pillar top portions 121 of the metal pillar 120 are provided. Therefore, the jointing interfaces of the POP stacked assembly is not a plane or not a pad where the solder jointing area can be expanded according to the depth of the first dimple holes 143. Normally, the length of the exposed pillar sidewalls of the first metal pillars 120 adjacent to the top ends of the first pillar top portions 121 is not greater than one-half of the first pillar height H2 of the first metal pillar 120.

Preferably, the first dimple holes 143 do not penetrate through the first molding core 140 where the depth of the first dimple holes 143 is greater than the encapsulating thickness of the first molding core 140 from the first top surface 142 to the first chip 130, i.e., the encapsulating thickness is the first package thickness T1 of the first molding core 140 minus the first chip-bonding height H1 of the first chip 130 minus the thickness of the first redistribution layer 110, to maintain the verticality of the first metal pillars 120. In the present embodiment, the first dimple holes 143 are V-shaped blind holes to have larger openings.

The fabrication processes of the above-mentioned semiconductor package 100 with Pillar-Top-Interconnection (PTI) configuration by Molded-Interconnect-Substrate (MIS) process are illustrated from FIG. 3A to FIG. 3E where the major processing steps are described in detail as follows.

Firstly, as shown in FIG. 3A, the first redistribution layer 110 is disposed on the carrier plane 11 through semiconductor IC fabrication wafer processes where the first redistribution layer 110 includes a plurality of first fan-in pads 111 and a plurality of first fan-out pads 112. The carrier plane 11 is provided by a temporary carrier 10 which can be a Wafer Support System (WSS) or a Panel Support System (PSS) where there is no substrate involved. The temporary carrier 10 can be a semiconductor wafer or a glass panel.

Figure 3B:
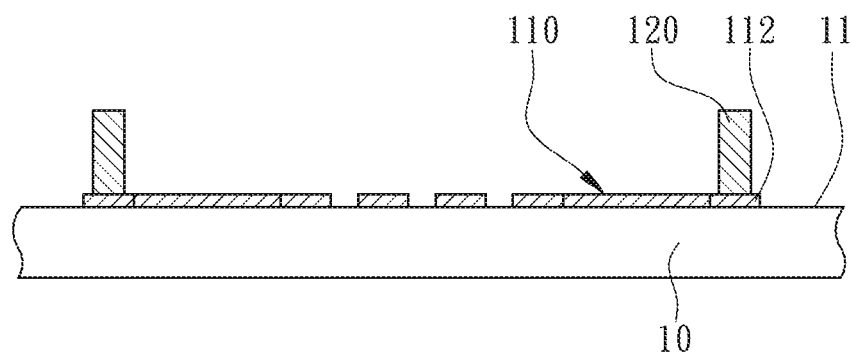
Figure 3C:
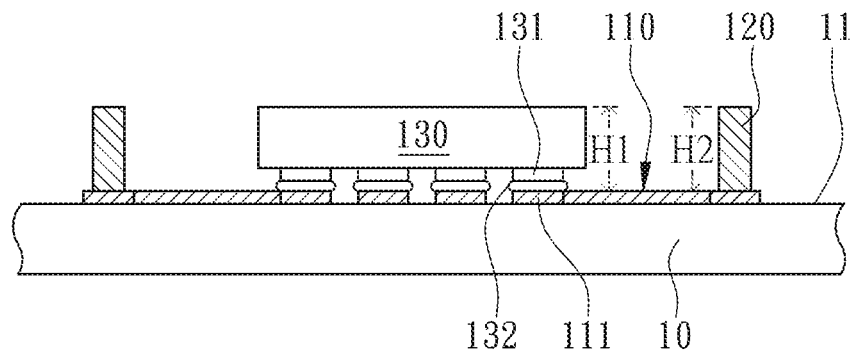

Then, as shown in FIG. 3B, the first metal pillars 120 are disposed on the first fan-out pads 112 by wafer plating or panel plating. Then, as shown in FIG. 3C, the first chip 130 is flip-chip bonded to the first redistribution layer 110 to physically and electrically connect to the first fan-in pads 111 by the first bumps and the first solder pastes 132.

Figure 3D:
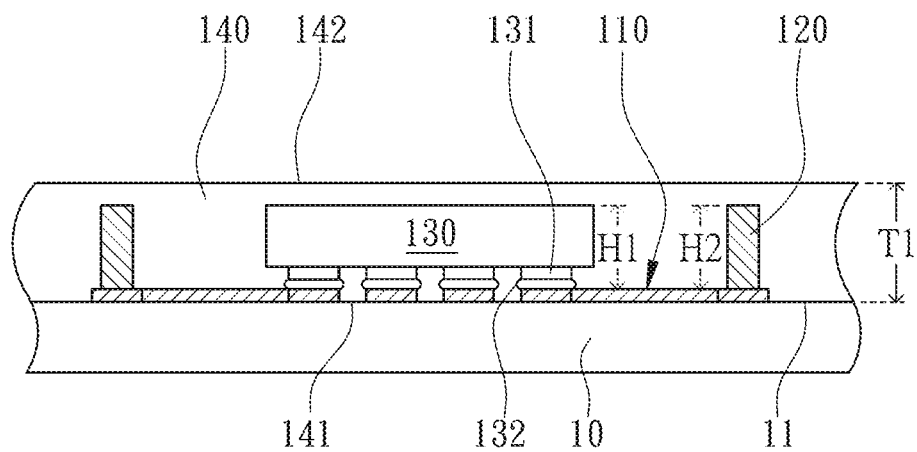

Then, as shown in FIG. 3D, a first molding core 140 is formed on the carrier plane 11 by the known wafer molding or panel molding technology. The first molding core 140 has a first bottom surface 141 and a first top surface 142 where the first bottom surface 141 is defined on the carrier plane 11 so that the first redistribution layer 111 is embedded inside the first molding core 140 from the first bottom surface 141. The first package thickness T1 of the first molding core 140 is defined from the first top surface 142 to the first bottom surface 141 where the first package thickness T1 is greater than the first chip-bonding height H1 of the first chip 130 so that the first chip 130 is completely embedded inside the first molding core 140 with the metal pillars 120 encapsulated at the peripheries of the first molding core 140.

Figure 3E:
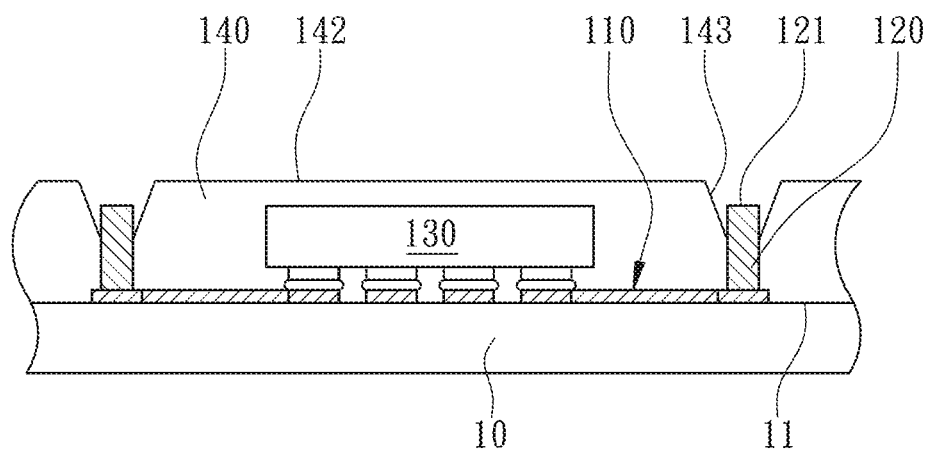

Then, as shown in FIG. 3E, a first dimpling step is executed to generate a plurality of first pillar top portions 121 of the first metal pillars 120 which are not encapsulated by the first molding core 140, which can be opened by laser drilling or by partial exposure. In the present embodiment, laser drilling is preferred where the material of the first molding core 140 can be non-photo sensitive material. After the first dimpling step, the first molding core 140 further has a plurality of first dimple holes 143 formed on the first top surface 142 where the first pillar top portions 121 including the corresponding pillar sidewalls of the metal pillars 120 are exposed from the first dimple holes 143. The first pillar top portions 121 are reentrant from the first top surface 142 and are exposed from the first molding core 140. Accordingly, the exposed parts of the first metal pillars 120 are not extruded from the first molding core 140. Then, the first molding core 140 is separated from the temporary carrier 10 by UV radiation to eliminate the adhesion of the temporary carrier 10 to peel off the first molding core 140 from the temporary carrier 140. Finally, a plurality of solder balls 190 are disposed on the fan-out pads 112 and are extruded from the first bottom surface 141 of the first molding core 140 to fabricate the semiconductor package 100 as shown in FIG. 2.

Furthermore, the fabrication processes of the above-mentioned semiconductor package with Pillar-Top-Interconnection (PTI) configuration as revealed in the present invention, the MIS processes can be implemented on the first molding core 140 only once or multiple times where each time when MIS processes are implemented comprises the step of fabricating RDL through electroplating, the step of fabricating metal pillars such as Cu pillar electroplating, the step of chip bonding through flip-chip die bonding, the step of fabricating the molding core through epoxy molding, and the step of dimpling to expose the pillar top portions of the metal pillars by laser drilling. Repeated MIS processes can achieve ultra-thin POP stacked assembly with a plurality of chips vertically stacked inside where the pillar top portions of the metal pillars are exposed for the physical and electrical connections for vertically stacking with other semiconductor package assembly.

Figure 4:
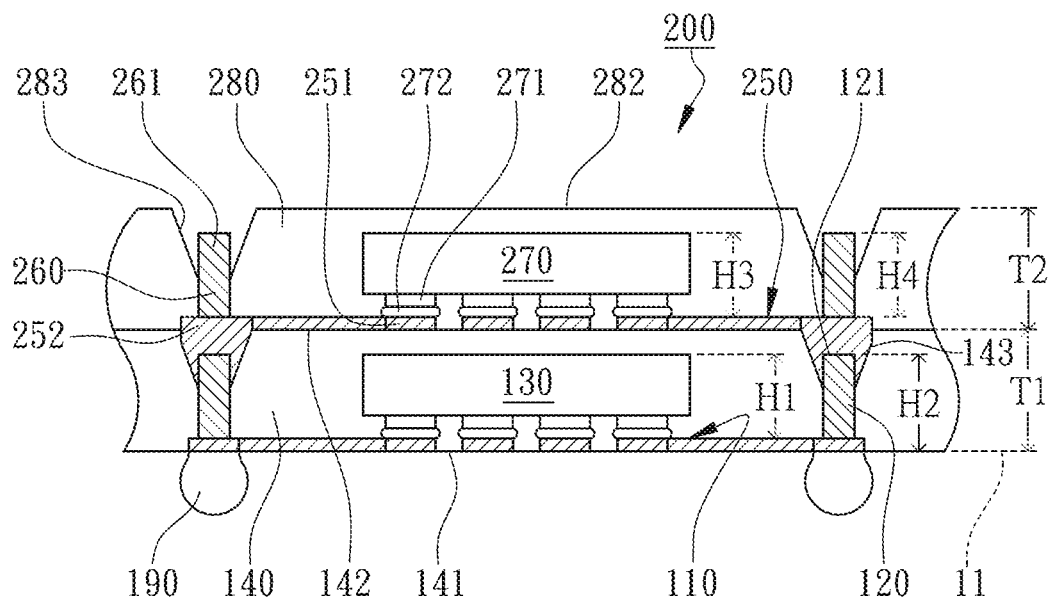
FIG. 4 is a cross-sectional view of a semiconductor package with Pillar-Top-Interconnection (PTI) configuration according to the second embodiment of the present invention.
Figure 5A:
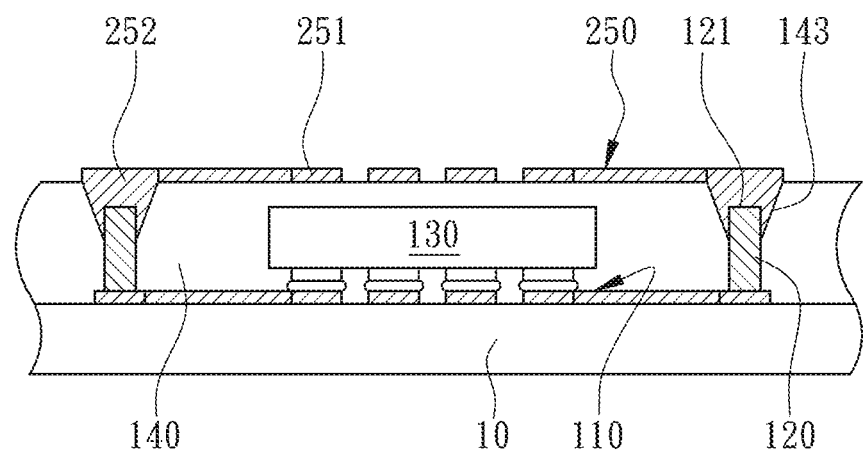
FIGS. 5A to 5E are cross-sectional views illustrating components manufactured during each major processing step of the semiconductor package structure by the second MIS processes according to the second embodiment of the present invention.
Figure 5B:
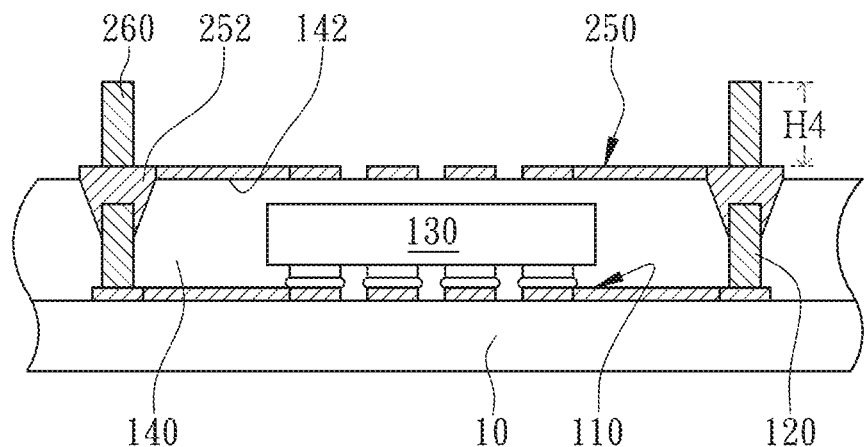
Figure 5C:
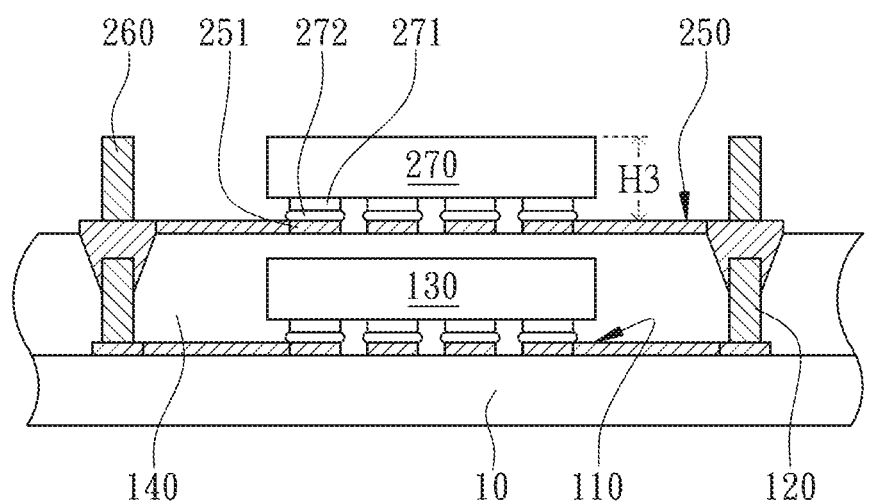
Figure 5D:
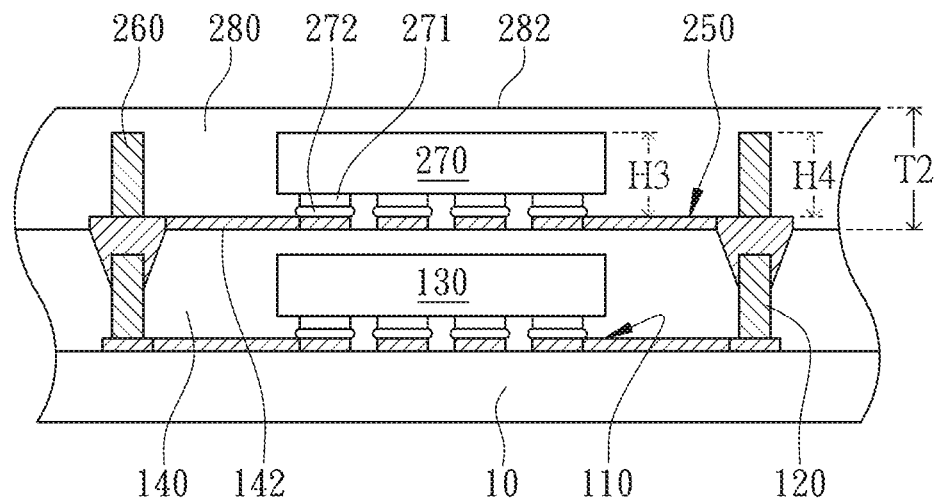
Figure 5E:
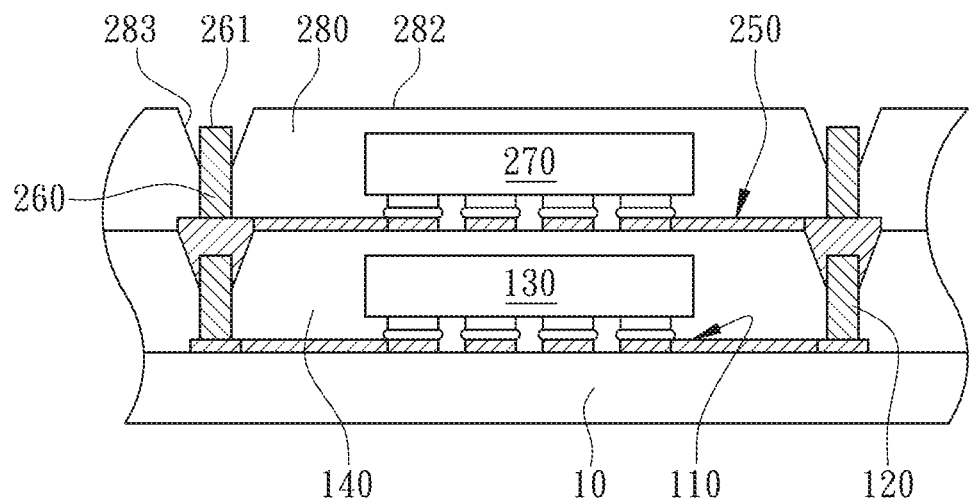
Figure 6:
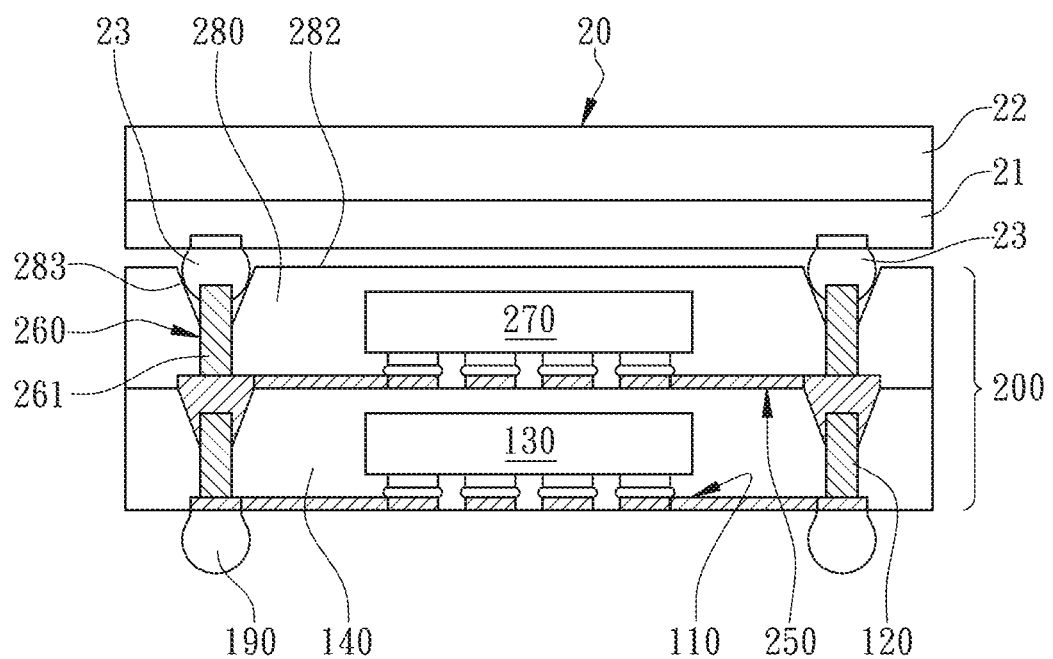
FIG. 6 is a cross-sectional view illustrating a POP stacked assembly by stacking the above-mentioned semiconductor packages according to the second embodiment of the present invention.

According to the second embodiment of the present invention, another semiconductor package 200 with Pillar-Top-Interconnection (PTI) configuration is illustrated in FIG. 4 for a cross-sectional view, from FIG. 5A to FIG. 5E for the cross-sectional views showing components manufactured during each major processing step of the semiconductor package by the second MIS processes, and in FIG. 6 for a cross-sectional view illustrating a POP stacked assembly by stacking a top package 20 on the semiconductor packages 200 where the components with the same names and functions corresponding to the first embodiment are followed without further description in detail. The semiconductor package 200 comprises a first redistribution layer 110, a plurality of metal pillars 120, a first chip 120, and a first molding core 140 mentioned fabricated by the first MIS processes where the semiconductor package 200 further comprises a second redistribution layer 250, a plurality of second metal pillars 260, a second chip 270, and a second molding core 280 fabricated by second MIS processes.

As shown in FIG. 4, the second redistribution layer 250 is disposed on the first top surface 142 of the first molding core 140. The second redistribution layer 250 includes a plurality of second fan-in pads 251 and a plurality of second fan-out pads 252 where the second fan-out pads 252 are electrically connected to the first pillar top portions 121 of the first metal pillars 120. The second metal pillars 260 are disposed on the second fan-out pads 252. The second chip 270 is bonded onto the second redistribution layer 250 and is electrically connected to the second fan-in pads 251. Preferably, the second metal pillars 260 have a second pillar height H4 which is smaller than a second package thickness T2 of the second molding core 280 but not less than a second chip-bonding height H3 of the second chip 270.

As shown in FIG. 4, the second molding core 280 is formed on the first top surface 142 of the first molding core 140 where the second bottom surface of the second molding core 280 is defined on the first top surface 142 so that the second redistribution layer 250 is embedded inside the second molding core 280 from the first top surface 142 where the second package thickness T2 of the second molding core 280 is greater than the second chip-bonding height H3 of the second chip 270 so that the second chip 270 is embedded inside the second molding core 280 with the second metal pillars 260 encapsulated at the peripheries of the second molding core 280. The second metal pillars 260 have a plurality of second pillar top portions 261 which are not encapsulated by the second molding core 280 to achieve zero gap in the POP stacked assembly to layer-by-layer stack more package assembly with the package thickness of a substrate. To be more specific, the second molding core 280 further has a plurality of second dimple holes 283 formed on the second top surface 282 with the second pillar top portions 261 including the corresponding pillar sidewalls of the second metal pillars 260 exposed inside the second dimple holes 283. The second pillar top portions 261 are reentrant from the second top surface 282 and exposed from the second molding core 280. Normally, the length of the exposed pillar sidewalls of the second metal pillars 260 to the second pillar top portions 261 is not greater than one-half of the second pillar height H4 of the metal pillars 260.

Therefore, the above-mentioned semiconductor package 200 can achieve zero gap between POP stacked assembly without a substrate thickness.

Preferably, the second fan-out pads 252 are inverted cone pads embracing the first pillar top portions 121 and the corresponding exposed pillar sidewalls of the first metal pillars 120 are also connected by the second fan-out pads 252 to avoid the joint breaking of the first pillar top portions 121 of the first metal pillars 120. The exposed area of the first pillar top portions 121 of the first metal pillars 120 can be controlled by the depth of the first dimple holes 143.

A fabrication method of the above-mentioned semiconductor package 200 with Pillar-Top-Interconnection (PTI) configuration is illustrated from FIG. 5A to FIG. 5E for cross-sectional views showing components manufactured during each major processing step of the semiconductor package structure by the second MIS processes. The second MIS processes are executed after the first dimpling step and before the separation of the first molding core 140 from the temporary carrier 10 as described in the first embodiment and the major processing steps of the second MIS processes are described in detail as follows.

Firstly, as shown in FIG. 5A, the second redistribution layer 250 is disposed on the first top surface 142 of the first molding core 140. The second redistribution layer 250 includes a plurality of second fan-in pads 251 and a plurality of second fan-out pads 252 where the second fan-out pads 252 are connected to the first pillar top portions 121 including the exposed pillar sidewalls of the first metal pillars 120. Then, as shown in FIG. 5B, the second metal pillars 260 are disposed on the second fan-out pads 252. Then, as shown in FIG. 5C, the second chip 270 is bonded onto the second redistribution layer 250 to electrically connect the second chip 270 to the second fan-in pads 251.

Then, as shown in FIG. 5D, the second molding core 280 is formed on the first top surface 142 of the first molding core 140 where the second bottom surface of the second molding core 280 is defined by the first top surface 142 so that the second redistribution layer 250 is embedded inside the second molding core 280 from the first top surface 142. The second package thickness T2 of the second molding core 280 is greater than the second chip-bonding height H3 of the second chip 270 and greater than the second pillar height H4 so that the second chip 270 is embedded inside the second molding core 280 with the second metal pillars 260 encapsulated at the peripheries of the second molding core 280.

Then, as shown in FIG. 5E, a second dimpling step is executed so that the second pillar top portions 261 of the second metal pillars 260 are exposed from the second molding core 280. In the present step, the second molding core 280 further has a plurality of second dimple holes 283 formed on the second top surface 282 so that the second pillar top portions 261 including the corresponding pillar sidewalls of the second metal pillars 260 are exposed in the second dimple holes 283. The second pillar top portions 261 are reentrant from the second top surface 282 and exposed from the first molding core 280. Then, the first molding core 140 is separated from the temporary carrier 10. Finally, a plurality of solder balls 190 are disposed on the fan-out pads 112 to fabricate the semiconductor package 200 as shown in FIG. 4.

As shown in FIG. 6, a top stacked package 20 is surface-mounted to the semiconductor package 200 where the top stacked package 20 comprises a substrate 21, an encapsulant 22 encapsulating a chip inside, and a plurality of solder balls 23 disposed under the substrate 21. The solder balls 23 are aligned to the second dimple holes 283 and are jointed to the second pillar top portions 261 so that the exposed pillar sidewalls of the second metal pillars 260 included in the second pillar top portions 261 are also jointed by the solder balls 23 through reflow processes.

The above description of embodiments of this invention is intended to be illustrative but not limited. Other embodiments of this invention will be obvious to those skilled in the art in view of the above disclosure which still will be covered by and within the scope of the present invention even with any modifications, equivalent variations, and adaptations.

What is claimed is:
1. A semiconductor package comprising:
   a first redistribution layer, the first redistribution layer including a plurality of first fan-in pads and a plurality of first fan-out pads;
   a plurality of first metal pillars disposed on the first fan-out pads;

a first chip bonded onto the first redistribution layer and electrically connected to the first fan-in pads;

a first molding core formed to encapsulate the first redistribution layer and the first chip, the first molding core having a first bottom surface coplanar to a surface of the first redistribution layer and a first top surface, wherein the first top surface is a planar surface having first dimple holes, each of the first dimple holes configured to expose a first pillar top portion of one of the first metal pillars;

a second redistribution layer disposed on the first top surface of the first molding core, the second redistribution layer including a plurality of second fan-in pads and a plurality of second fan-out pads, wherein the second fan-out pads are formed in the first dimple holes and configured to electrically couple to the first pillar top portions of the first metal pillars;

a plurality of second metal pillars disposed on the second fan-out pads;

a second chip bonded onto the second redistribution layer and electrically connected to the second fan-in pads; and a second molding core formed on the first top surface of the first molding core and configured to encapsulate the second redistribution layer and the second chip, the second molding core having a second top surface, wherein the second top surface is a planar surface having second dimple holes, each of the second dimple holes configured to expose a second pillar top portion of one of the second metal pillars, wherein the second fan-out pads are inverted cone pads embracing the first pillar top portions and pillar sidewalls of the first metal pillars.

2. The semiconductor package as claimed in claim 1, wherein the first dimple holes do not penetrate through the first molding core.

3. The semiconductor package as claimed in claim 2, wherein a depth of the first dimple holes is greater than an encapsulating thickness of the first molding core over the first chip.

4. The semiconductor package as claimed in claim 1, wherein a first pillar height of the first metal pillars is smaller than a first package thickness of the first molding core between the first bottom surface and the first top surface but not less than a first chip-bonding height of the first chip.

5. The semiconductor package as claimed in claim 1, wherein the first chip is flip-chip bonded to the first fan-in pads by a plurality of first bumps of the first chip.

6. The semiconductor package as claimed in claim 1, further comprising a plurality of solder balls jointed to the first fan-out pads and extruded from the first bottom surface.

* * * * *